(12) United States Patent
Agemura (10) Patent No.: US 10,249,471 B2
(45) Date of Patent: Apr. 2, 2019

(54) COMPOSITE CHARGED PARTICLE BEAM APPARATUS AND CONTROL METHOD THEREOF

(71) Applicant: Hitachi High-Technologies Corporation, Tokyo (JP)

(72) Inventor: Toshihide Agemura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/534,219

(22) PCT Filed: Dec. 26, 2014

(86) PCT No.: PCT/JP2014/084454
§ 371 (c)(1),
(2) Date: Jun. 8, 2017

(87) PCT Pub. No.: WO2016/103432
PCT Pub. Date: Jun. 30, 2016

(65) Prior Publication Data
US 2017/0330722 A1   Nov. 16, 2017

(51) Int. Cl.
*H01J 37/073* (2006.01)
*H01J 37/28* (2006.01)
(Continued)

(52) U.S. Cl.
CPC .......... *H01J 37/073* (2013.01); *H01J 37/241* (2013.01); *H01J 37/28* (2013.01); *H01J 37/3005* (2013.01);
(Continued)

(58) Field of Classification Search
CPC .... H01J 2237/022; H01J 37/073; H01J 37/28; H01J 37/317; H01J 37/3005;
(Continued)

(56) References Cited

U.S. PATENT DOCUMENTS

| 7,615,765 B2 | 11/2009 | Katagiri et al. |
| 7,781,743 B2 | 8/2010 | Katagiri et al. |

(Continued)

FOREIGN PATENT DOCUMENTS

| JP | 2007-157682 A | 6/2007 |
| JP | 2009-004112 A | 1/2009 |
| WO | 2014/171287 A1 | 10/2014 |

OTHER PUBLICATIONS

International Search Report of PCT/JP2014/084454 dated Feb. 10, 2015.

*Primary Examiner* — Nicole M Ippolito
*Assistant Examiner* — Sean M Luck
(74) *Attorney, Agent, or Firm* — Mattingly & Malur, PC (57) ABSTRACT

The present invention relates to an automatic sequence for repeatedly performing SEM observation and FIB processing by using a low acceleration voltage for a long time. In order to realize very accurate three-dimensional structure/composition analysis, in the automatic sequence for repeatedly performing sample observation using a scanning electron microscope using a CFE electron source and sample processing using a FIB device, low temperature flushing using the CFE electron source is performed at predetermined timing except for a SEM observation time. According to the present invention, the automatic sequence for repeatedly performing the sample observation using the scanning electron microscope using the CFE electron source and the sample processing using the FIB device can be performed for a long time. Therefore, it is possible to acquire a SEM image which achieves high resolution and improved current stability while the low acceleration voltage is used.

18 Claims, 8 Drawing Sheets

(51) Int. Cl.
*H01J 37/317* (2006.01)
*H01J 37/30* (2006.01)
*H01J 37/305* (2006.01)
*H01J 37/24* (2006.01)

(52) U.S. Cl.
CPC .......... *H01J 37/305* (2013.01); *H01J 37/317* (2013.01); *H01J 37/3178* (2013.01); *H01J 2237/022* (2013.01); *H01J 2237/28* (2013.01); *H01J 2237/2814* (2013.01); *H01J 2237/30472* (2013.01); *H01J 2237/3174* (2013.01); *H01J 2237/31732* (2013.01); *H01J 2237/31749* (2013.01)

(58) Field of Classification Search
CPC .... H01J 37/305; H01J 37/3178; H01J 37/241; H01J 2237/28; H01J 2237/2814; H01J 2237/30472; H01J 2237/31732; H01J 2237/3174; H01J 2237/31749
See application file for complete search history.

(56) References Cited

U.S. PATENT DOCUMENTS

| | | | | |
|---|---|---|---|---|
| 8,563,950 | B2* | 10/2013 | Nakayama | B82Y 10/00 250/306 |
| 2005/0052103 | A1* | 3/2005 | Katagiri | H01J 7/16 313/7 |
| 2006/0072084 | A1* | 4/2006 | Van Herpen | B08B 7/0035 355/30 |
| 2006/0231773 | A1* | 10/2006 | Katagiri | H01J 41/12 250/492.1 |
| 2009/0294697 | A1* | 12/2009 | Katagiri | H01J 37/18 250/492.3 |
| 2012/0183905 | A1* | 7/2012 | Terashima | H01J 37/3177 430/296 |
| 2013/0186747 | A1* | 7/2013 | Schmidt | G01N 1/286 204/192.33 |
| 2013/0264496 | A1* | 10/2013 | Arai | H01J 37/06 250/489 |

* cited by examiner

COMPOSITE CHARGED PARTICLE BEAM APPARATUS AND CONTROL METHOD THEREOF

TECHNICAL FIELD

The present invention relates to a composite charged particle beam apparatus including a scanning electron microscope using a CFE electron source and a focused ion beam device.

BACKGROUND ART

JP-A-2009-4112 (PTL 1) and JP-A-2007-157682 (PTL 2) disclose a pump mechanism for maintaining the surrounding of an electron source in a high vacuum state ($10^{-7}$ to $10^{-8}$ Pa) in a composite charged particle beam apparatus in which a focused ion beam (FIB) device for processing a sample section is combined with a scanning electron microscope (SEM) for observing the processed sample section.

Pamphlet of International Publication No. 2014/171287 (PTL 3) discloses SEM (CFE-SEM) using a cold field emission (CFE) electron source which does not always heat an electron source. The SEM performs low temperature flushing on the CFE electron source during SEM observation. The flushing means heat treatment for obtaining a clean surface by desorbing a gas molecule adsorbed on the electron source. In addition, the low temperature flushing means flushing while an extraction voltage is applied in a stage before gas is completely adsorbed to a distal end of the CFE electron source after a prescribed time limit (high brightness stabilized region) having less influence of residual gas adsorption exceeds immediately after the flushing. Since the gas is not yet completely adsorbed, it is possible to desorb the adsorbed gas at a much lower degree compared to normal flushing. In addition, since the temperature is low, even while the extraction voltage is applied, there is no build-up which changes a shape of the distal end of the electron source.

CITATION LIST

Patent Literature

PTL 1: JP-A-2009-4112
PTL 2: JP-A-2007-157682
PTL 3: Pamphlet of International Publication No. 2014/171287

SUMMARY OF INVENTION

Technical Problem

Currently, the SEM mounted on a commercially-available composite charged particle beam apparatus employs a Schottkey emission (SE) electron source. The SE electron source is very stable to such an extent that current stability is 2%/hr or lower. The reason is that the SE electron source is suitable for an automatic sequence in which FIB processing and SEM observation of a machining section are repeatedly performed so as to perform a three-dimensional structure/composition analysis.

Under these circumstances, the present inventor has intensively studied an automatic sequence of very accurate three-dimensional structure/composition analysis. As a result, the present inventor has found that it is necessary to lower an acceleration voltage of SEM as a processing repetition width (processing step) using FIB becomes smaller. The reason is as follows. If a penetrating depth of an electron beam penetrating into a sample during the SEM observation is deeper than the processing repetition width using FIB, information except for the sample to be included in the currently performed processing step, that is, information of a processing step to be subsequently performed is included. For example, in a case where the processing step is set to 10 nm and silicon is used as a material, in the SEM observation using the acceleration voltage of 2 kV, the penetrating depth of the electron beam is approximately 40 nm. In a case where only the information in the processing step is to be extracted, the acceleration voltage of SEM needs to be 1 kV or lower.

However, the above-described SE electron source has an energy width which is as wide as 0.6 eV. Accordingly, resolution is degraded at a low acceleration voltage. Therefore, the SE electron source is not suitable for section observation since.

Therefore, the present inventor has progressively carried out design and development in order to achieve a world's first commercially-available composite charged particle beam apparatus whose energy width is narrow and which employs the CFE electron source suitable for the SEM observation using the low acceleration voltage. As a result, the present inventor has found the following. Even if the pump mechanism disclosed in PTL 1 or PTL 2 is employed so as to maintain the high vacuum state, the sample has to be irradiated with the electron beam, and the electron source is exposed to gas backflow from the sample side. Consequently, the high brightness stabilized region is approximately 100 min practically. As the very accurate three-dimensional structure/composition analysis is required, the processing step is shortened. It is assumed that 1,000 or more sheets of SEM image are repeatedly acquired over 24 hours or longer.

On the other hand, the low temperature flushing disclosed in PTL 3 is performed while an observation condition is maintained during the SEM observation. However, in the automatic sequence for repeatedly performing the FIB processing and the SEM observation, if the low temperature flushing is performed during the SEM observation, disturbance appears on an image obtained only when the low temperature flushing is performed, and information of a section observation SEM image is partially lost. In the automatic sequence for repeatedly performing the FIB processing, backtracking is not possible since the observation section is lost due to the repeated processing. The lack of observation section information is a fatal problem in the three-dimensional structure/composition analysis.

An object of the present invention is to realize very accurate three-dimensional structure/composition analysis through an automatic sequence for repeatedly performing SEM observation and FIB processing for a long time by using a low acceleration voltage.

Solution to Problem

The present invention relates to an automatic sequence for repeatedly performing sample observation using a scanning electron microscope using a CFE electron source and sample processing using a FIB device. In the automatic sequence, low temperature flushing of the CFE electron source is performed at predetermined timing except for a SEM observation time.

Advantageous Effects of Invention

According to the present invention, the automatic sequence for repeatedly performing the sample observation using the scanning electron microscope using the CFE electron source and the sample processing using the FIB device can be performed for a long time. Therefore, it is possible to acquire a SEM image which achieves high resolution and improved current stability while a low acceleration voltage is used.

DESCRIPTION OF EMBODIMENTS

An embodiment discloses a composite charged particle beam apparatus including a CFE-SEM that uses a CFE electron source for irradiating a sample with an electron beam, a FIB device that irradiates the sample with an ion beam, and a control unit that controls an automatic sequence for repeatedly performing sample observation using the CFE-SEM and sample processing using the FIB device. In the automatic sequence, during the sample processing using the FIB device, or during a transition time between the sample observation using the CFE-SEM and the sample processing using the FIB device, the control unit performs flushing while an extraction voltage is applied to the CFE electron source.

In addition, an embodiment discloses a control method in an automatic sequence for repeatedly performing sample observation using a CFE-SEM and sample processing using a FIB device. During the sample processing using the FIB device, or during a transition time between the sample observation using the CFE-SEM and the sample processing using the FIB device, flushing is performed while an extraction voltage is applied to a CFE electron source.

In addition, the embodiment discloses that in the automatic sequence, the sample observation using the CFE-SEM and sample section machining using the FIB device are repeatedly performed so as to perform three-dimensional structure/composition analysis on the sample.

In addition, the embodiment discloses that the composite charged particle beam apparatus further includes a gas nozzle that introduces deposition gas. The embodiment discloses that in the automatic sequence, the sample observation using the CFE-SEM and position processing using the FIB device are repeatedly performed.

In addition, the embodiment discloses that the composite charged particle beam apparatus further includes a gas nozzle that introduces etching gas. The embodiment discloses that in the automatic sequence, the sample observation using the CFE-SEM and an assist etching process using the FIB device and assist etching gas are repeatedly performed.

In addition, the embodiment discloses that in the automatic sequence, the flushing is performed with the lapse of a prescribed time after the sample processing using the FIB device starts.

In addition, the embodiment discloses that in the automatic sequence, the flushing is performed with the lapse of a prescribed time after the sample processing using the FIB device ends.

In addition, the embodiment discloses that in the automatic sequence, the flushing is performed with the lapse of a prescribed time after the sample observation using the CFE-SEM ends.

In addition, the embodiment discloses that in the automatic sequence, the flushing is repeatedly performed during the sample processing using the FIB device, and another flushing which is stronger than the flushing is performed after the sample observation using the CFE-SEM.

In addition, the embodiment discloses that the ion beam is a gallium ion beam, a neon ion beam, an argon ion beam, a helium ion beam, a xenon ion beam, an oxygen ion beam, or a nitrogen ion beam.

Hereinafter, the above-described and other novel characteristics and advantageous effects will be described with reference to the drawings. The drawings are used exclusively for facilitate the understanding of the invention, and do not limit the scope of the right.

Embodiment 1

Figure 1:
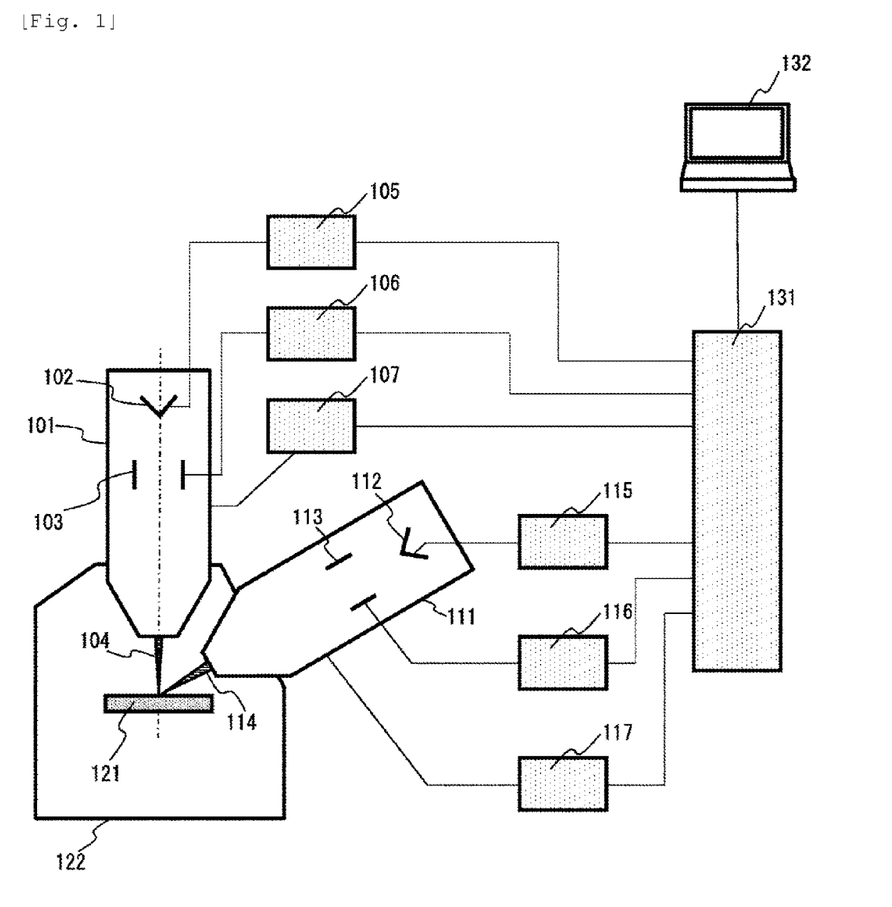
FIG. 1 is a schematic configuration diagram of a composite charged particle beam apparatus according to Embodiment 1.

FIG. 1 is a schematic configuration diagram of a composite charged particle beam apparatus according to the present embodiment.

In a basic configuration of the composite charged particle beam apparatus according to the present embodiment, a SEM column 101 which irradiates a sample 121 with an electron beam 104 is vertically disposed for a sample chamber 122 in which the sample 121 is internally disposed. In addition, a FIB column 111 which irradiates the sample 121 with an ion beam 114 is obliquely disposed in the sample chamber 122. The basic configuration includes a control system which controls each configuration element. The SEM column 101 may be obliquely disposed, and the FIB column may be vertically disposed in the sample chamber 122.

The SEM column 101 for irradiating the sample 121 with the electron beam 104 internally has an electron gun unit 102 including a CFE electron source, and an electron beam blanking unit 103 including a blanking electrode for electrostatically deflecting the electron beam. The electron gun unit 102 is evacuated by an ion pump (not illustrated) and a non-evaporative getter (NEG) pump, and the surrounding of an electron source is maintained in a high vacuum state. An orbitron pump may be used. The CFE electron source represents an electron source obtained in such a way that a distal end of a tungsten single crystal bar is sharpened to have a radius of approximately 100 nm by means of etching or heat treatment. During a normal use, the CFE electron source is not heated, and is always exposed to residual gas adsorption/desorption phenomena around the electron source. Due to these phenomena, a probe current is unstable. The CFE electron source may be LaB6 single crystal or CeB6 single crystal.

In addition, the SEM column 101 is controlled by an electron gun control high voltage power supply processing unit 105 which not only applies a high voltage to an extraction electrode of the CFE electron source, but also performs heat treatment by supplying an electric current to a filament holding the above-described tungsten single crystal bar, an electron beam blanking processing unit 106 which temporarily blocks the irradiation of the sample 121 with the electron beam by controlling the above-described blanking electrode, and a SEM column control processing unit 107 which performs overall control of the SEM column 101. Although not illustrated, the SEM column 101 includes a condenser lens for focusing the electron beam 104 on the sample 121 disposed inside the sample chamber 122, an objective lens, a diaphragm, an astigmatism corrector, and an axis corrector. In addition, the SEM column 101 has a deflector for deflecting or shifting the beam on the sample 121 or a beam shift function.

The FIB column 111 for irradiating the sample 121 with the ion beam 114 internally has an ion gun unit 112 including an ion source, and an ion beam blanking unit 113 including the blanking electrode for electrostatically deflecting the ion beam. The ion gun unit 112 is evacuated by an ion pump (not illustrated) and a non-evaporative getter (NEG) pump, and the surrounding of the ion source is maintained in a high vacuum state. An orbitron pump may be used. The ion source uses a gallium ion, but may use rare gas such as argon, neon, xenon, and helium, or gas such as oxygen and nitrogen.

In addition, the FIB column 111 is controlled by an ion gun control high voltage power supply processing unit 115 which generates the ion beam by applying a high voltage to the above-described ion source, an ion beam blanking processing unit 116 which temporarily blocks the irradiation of the sample 121 with the ion beam by controlling the above-described blanking electrode, and a FIB column control processing unit 117 which performs overall control on the FIB column 111. Although not illustrated, the FIB column 111 includes a condenser lens for focusing the ion beam 114 on the sample 121 disposed inside the sample chamber 122, an objective lens, a diaphragm, an astigmatism corrector, and an axis corrector. In addition, the FIB column 111 has a deflector for deflecting or shifting the beam on the sample 121 or a beam shift function.

Here, both the electron beam blanking unit 103 and the ion beam blanking unit 113 are controlled by being turned on in a case where the sample is not irradiated with the beam and by being turned off in a case where the sample is irradiated with the beam. This function can be substituted by the above-described deflector or axis corrector without using the electron beam blanking unit 103 and the ion beam blanking unit 113.

Although not illustrated, the sample chamber 122 serving as a vacuum chamber internally has a sample stage which holds and moves the sample 121, and a detector which detects a signal generated from the sample 121 irradiated with the electron beam 104 or the sample 121 irradiated with the ion beam 111. The sample stage is capable of five axis drive such as three-dimensional movement, tilting, and rotation. The detector includes a secondary electron detector, a backscattered electron detector, a secondary ion detector, a tertiary electron detector, an X-ray detector, and a photoelectric detector. The sample chamber 122 is internally evacuated by a turbo-molecular pump (not illustrated). A pump similar to the pump for evacuating the electron gun unit 102 or the ion gun unit 112 may be used. The SEM column 101, the FIB column 111, and the sample chamber 122 are connected to each other via pores (apertures), and have a differential evacuation structure.

Each control unit of the SEM column 101 and the FIB column 111 is integrally controlled by a common control microcomputer unit 131. Image display and an operation of both the columns are performed by PC/WS 132. Switching between the SEM observation and the FIB processing is realized by the common control microcomputer unit 131 controlling each of the electron beam blanking unit 103 and the ion beam unit 113 via the electron beam blanking processing unit 106 and the ion beam blanking processing unit 116. In addition, heat treatment of the CFE electron source is realized in such a way that the common microcomputer unit 131 controls the electron gun control high voltage power supply processing unit 105.

Before the apparatus is used, an electron gun heating unit disposed around the electron gun unit 102 is caused to generate heat, the electron gun unit 102 is heated, and the gas discharged from a wall surface of the electron gun unit 102 is exhausted (baking). In this manner, the surrounding of the electron source can be maintained in a high vacuum state.

Next, the filament holding the tungsten single crystal bar is heated by supplying an electric current, and strong flushing is performed until the surface of the CFE electron source is brought into a state having no adsorbed gas layer.

Even in a case where only the SEM observation is performed, the sample has to be irradiated with the electron beam, and thus, the CFE electron source is exposed to gas backflow from the sample side. Therefore, low temperature flushing is performed if a predetermined time elapses from the preceding flushing including the strong flushing when the apparatus starts to be used. In this case, disturbance appears on an image. However, there is no problem since the disturbance can be repaired by scanning the sample again with the electron beam.

Figure 2:
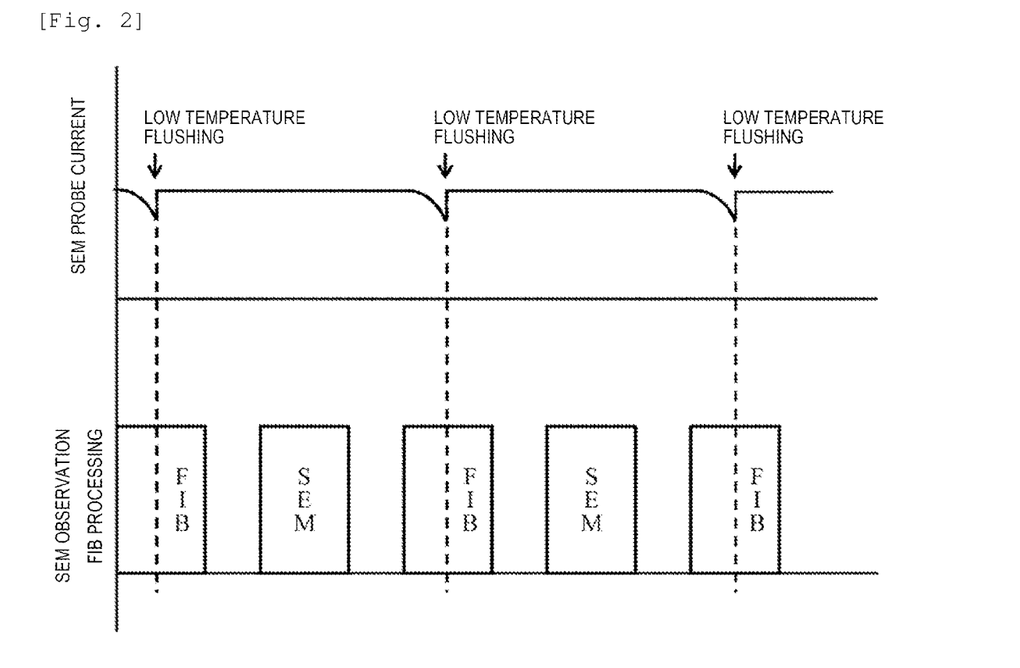
FIG. 2 is a time chart illustrating timing of low temperature flushing according to Embodiment 1.

FIG. 2 is a time chart illustrating timing of the low temperature flushing in the automatic sequence for repeatedly performing the FIB processing and the SEM observation. The low temperature flushing is performed at timing during the FIB processing after a predetermined time elapses from when the FIB processing starts. During the FIB processing, the SEM observation is not performed. Accordingly, there is no possibility that a section observation SEM image may be disturbed due to the low temperature flushing and information may be partially lost. Before the automatic sequence starts, a processing time of each processing step is known by setting a FIB processing step width, a processing range, a pixel time, and the number of sheets to be processed. Similarly, in acquiring the SEM image, a time for acquiring one sheet of the SEM image is known by setting a frame time for one image, a pixel time, and the number of accumulated frames. A time between the FIB processing time for each processing step and the SEM observation time, that is, a transition time may be optionally set. The FIB processing start, the FIB processing end, the SEM observation start, and the SEM observation end can be recognized by setting each flag in software. The timing to perform the low temperature flushing can be set by receiving the flags. The FIB processing time for each processing step depends on the above-described conditions, but is typically several seconds to several tens of seconds. In addition, the SEM observation time depends on the above-described conditions, a time required for obtaining necessary SN, and a SEM probe current, but is typically several seconds to 100 seconds.

Although the automatic sequence for repeatedly performing the FIB processing and the SEM observation is performed for 48 hours (the low temperature flushing is performed once every approximately 30 minutes), the present inventor can confirm that focus offset, visual field deviation, and a brightness change are acceptable.

In the composite charged particle beam apparatus using the SE electron source in the related art, even if the SE electron source and a monochromator are combined with each other in order to obtain approximately the same energy width as that of the CFE electron source, a beam current is extremely lowered, and contrast becomes worse. In order to observe a machining section with sufficient contrast, an image acquisition time is inevitably lengthened, and the lengthened time is particularly unsuitable for the sample which is weak against the electron beam irradiation. However, according to the present embodiment, the processing step in the three-dimensional structure/composition analysis of the sample can be minimized. Therefore, with regard to each machining section, it is possible to acquire a SEM image which achieves high resolution and improved current stability while a low acceleration voltage is used. For example, with regard to silicon, if the processing step is set to 10 nm and the SEM acceleration voltage is set to 1 kV, the three-dimensional structure/composition analysis can be performed by extracting only the information in the processing step from the electron beam having a narrow energy width which is a feature of the CFE electron source.

Embodiment 2

According to the present embodiment, unlike Embodiment 1, the low temperature flushing is performed during the transition time that the FIB processing is switched to the SEM observation after the FIB processing. Hereinafter, a point different from that of Embodiment 1 will be mainly described.

Figure 3:
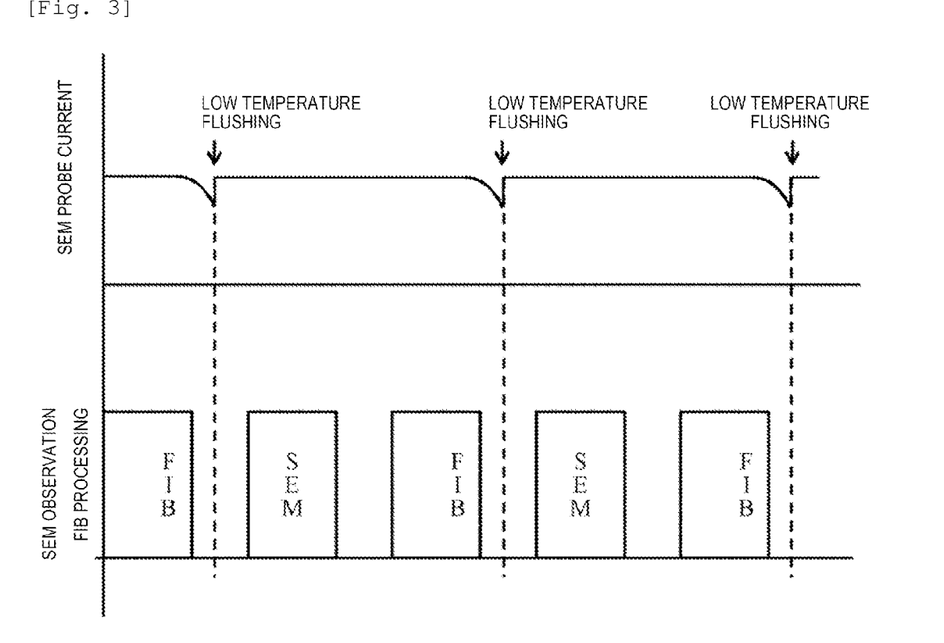
FIG. 3 is a time chart illustrating timing of low temperature flushing according to Embodiment 2.

FIG. 3 is a time chart illustrating timing of the low temperature flushing in the automatic sequence for repeatedly performing the FIB processing and the SEM observation according to the present embodiment. According to the present embodiment, the low temperature flushing is performed at timing during the transition time that a predetermined time after the FIB processing ends. The low temperature flushing is performed immediately before the SEM observation. Accordingly, the SEM image can be acquired in a reliable high brightness stabilized region.

Embodiment 3

According to the present embodiment, unlike Embodiments 1 and 2, the low temperature flushing is performed during the transition time that the SEM observation is switched to the FIB processing after the SEM observation. Hereinafter, a point different from that of Embodiments 1 and 2 will be mainly described.

Figure 4:
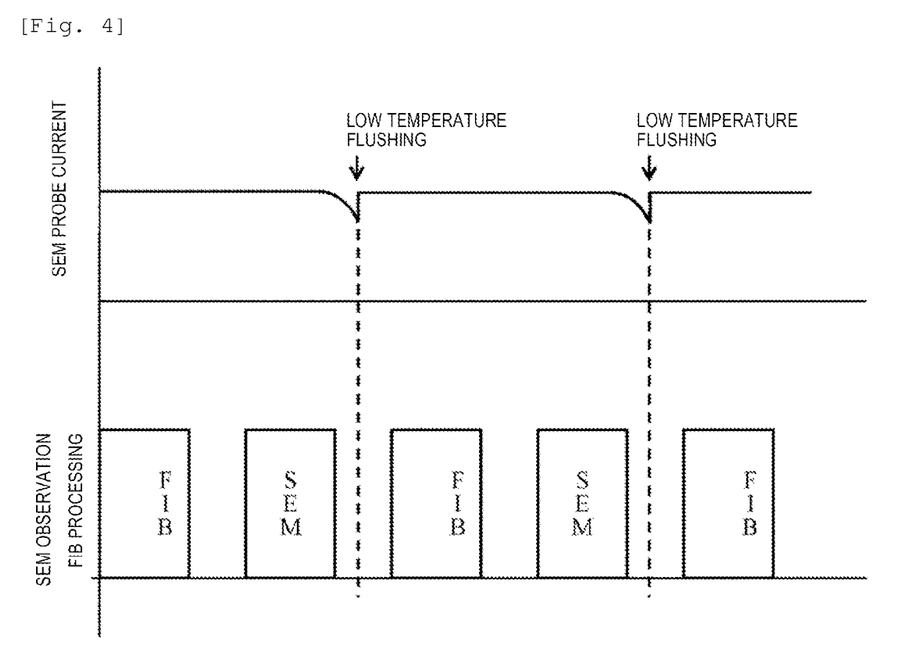
FIG. 4 is a time chart illustrating timing of low temperature flushing according to Embodiment 3.

FIG. 4 is a time chart illustrating timing of the low temperature flushing in the automatic sequence for repeatedly performing the FIB processing and the SEM observation according to the present embodiment. According to the present embodiment, the low temperature flushing is performed at timing during the transition time that a predetermined time after the SEM observation ends. The low temperature flushing is performed immediately after the SEM observation, and there is enough time until the subsequent SEM observation. Accordingly, the low temperature flushing can be reliably performed.

Embodiment 4

The present embodiment is realized by combining Embodiment 2 and Embodiment 3 with each other. Hereinafter, a point different from that of Embodiments 1 to 3 will be mainly described.

Figure 5:
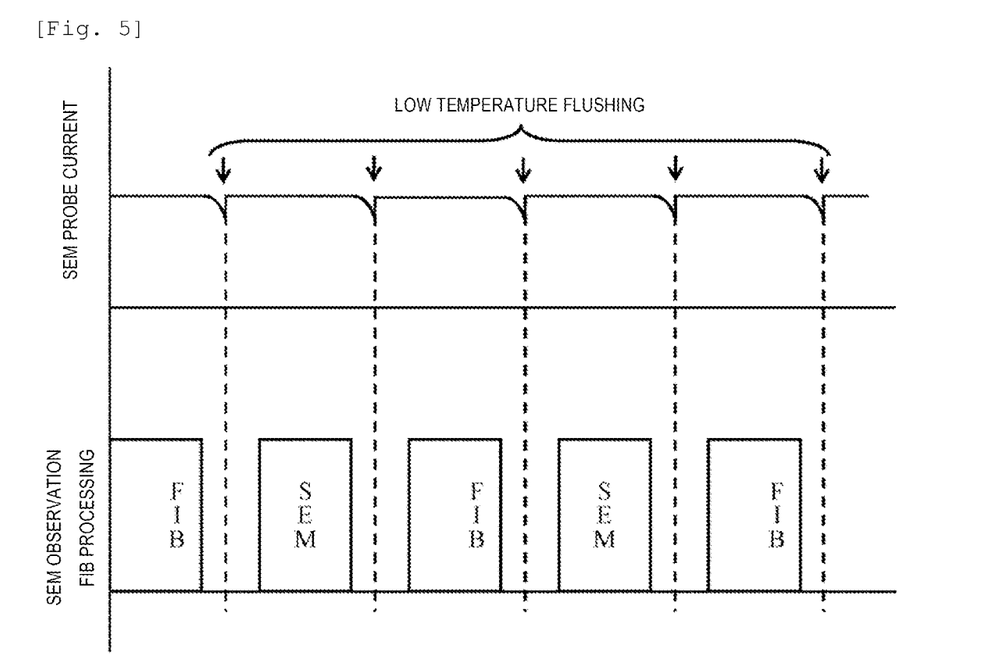
FIG. 5 is a time chart illustrating timing of low temperature flushing according to Embodiment 4.

FIG. 5 is a time chart illustrating timing of the low temperature flushing in the automatic sequence for repeatedly performing the FIB processing and the SEM observation according to the present embodiment. According to the present embodiment, the low temperature flushing is performed at timing during the transition time that a predetermined time after the FIB processing and the SEM observation respectively end. The low temperature flushing is frequently and continuously performed. Accordingly, compared to Embodiment 2, the image can be acquired in a more reliable high brightness stabilized region.

Embodiment 5

According to the present embodiment, unlike Embodiments 1 to 4, the low temperature flushing and strong flushing are performed. Hereinafter, a point different from that of Embodiments 1 to 4 will be mainly described.

In many cases, a general composite charged particle beam apparatus includes a gas nozzle which introduces deposition gas represented by Pt and C or etching gas represented by $XeF_2$. Then, the FIB device is used not only for a sputtering process but also for deposition using precursor gas and an assist etching process. During this FIB operation, that is, while the deposition or the assist etching is performed using the FIB device, the precursor gas reaches the inside of the SEM column or the surrounding of the CFE electron source. Consequently, a probe current attenuation time is shortened. In this case, it is desirable to perform the low temperature flushing in combination with the same strong flushing as that performed before the apparatus is used.

Figure 6:
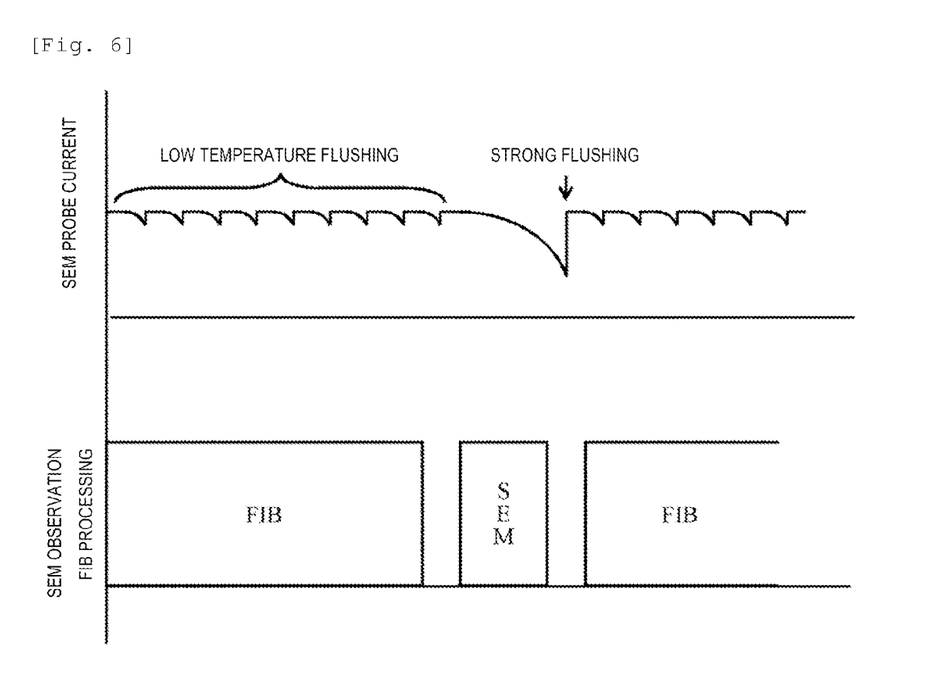
FIG. 6 is a time chart illustrating timing of low temperature flushing and strong flushing according to Embodiment 5.

FIG. 6 is a time chart illustrating timing of the low temperature flushing and the strong flushing in the automatic sequence for repeatedly performing the FIB processing and the SEM observation according to the present embodiment. According to the present embodiment, During the FIB operation, the low temperature flushing is repeatedly performed at short intervals. On the other hand, during the SEM observation after FIB is switched to SEM, the low temperature flushing is not performed. At timing that the SEM observation is switched to the FIB operation by the introduced precursor gas, a vacuum degree around the CFE electron source is still in a deteriorated state. During the SEM observation, many probe currents are attenuated, thereby resulting in a possibility that a clean surface for maintaining the high brightness stabilized region cannot be obtained at the temperature of the low temperature flushing. Therefore, during the transition time that the SEM observation is switched to the FIB operation, flushing which is strong enough to desorb the adsorbed gas is performed. After the clean surface is obtained, the low temperature flushing is repeatedly performed again during the FIB operation. In this manner, even after the sequence of introducing the precursor gas, a stable probe current can be obtained immediately after the FIB operation is switched to the SEM observation.

In a case where the deposition or the etching is performed using the electron beam, post-processing or processing during the FIB processing may be performed in the same manner as that according to the present embodiment.

INDUSTRIAL APPLICABILITY

Figure 7:
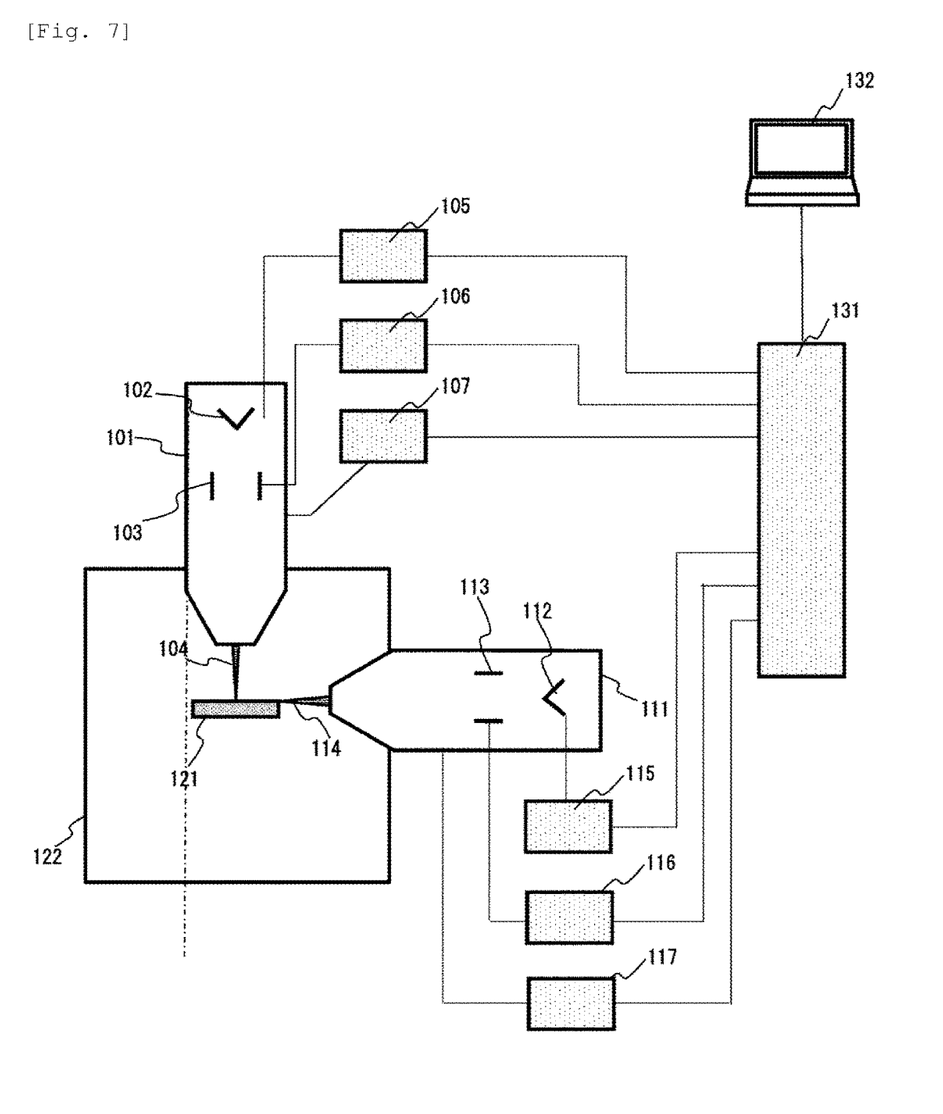
FIG. 7 is a schematic configuration diagram of a composite charged particle beam apparatus in which a FIB column and a SEM column are orthogonally arranged.
Figure 8:
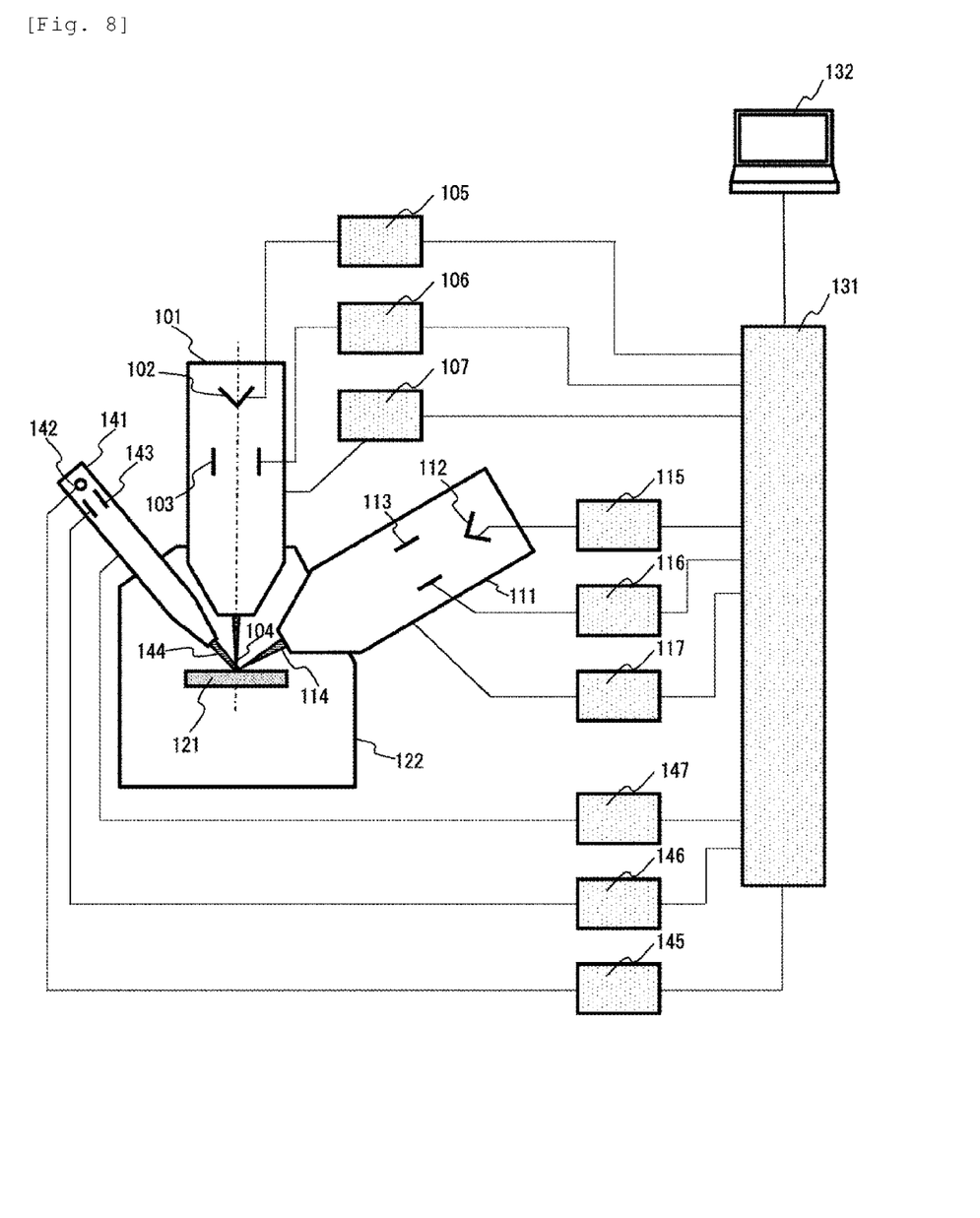
FIG. 8 is a schematic configuration diagram of a composite charged particle beam apparatus having a triple beam configuration.

Hitherto, the composite charged particle beam apparatus according to Embodiment 1 has been described as a reference. However, the present invention is also applicable to the composite charged particle beam apparatus having a configuration in which the FIB column 111 and the SEM column 101 are orthogonally arranged as illustrated in FIG. 7. In addition, for example, the present invention is also applicable to the composite charged particle beam apparatus having a triple beam configuration further equipped with an argon ion beam column 141 for irradiating the sample with an argon ion beam 144 as illustrated in FIG. 8. Similarly to the SEM column 101 and the FIB column 111, the argon ion beam column 141 internally has an ion gun unit 142 including an argon ion source, and an argon ion beam blanking unit 143 including a blanking electrode for electrostatically deflecting the argon ion beam. In addition, the argon ion beam column 141 is controlled by an argon ion gun control high voltage power supply processing unit 145 which generates the argon ion beam by applying a high voltage to the above-described argon ion source, an argon ion beam blanking processing unit 146 which temporarily blocks the irradiation of the sample 121 with the argon ion beam by controlling the above-described blanking electrode, and an argon ion beam column control processing unit 147 which performs overall control on the argon ion beam column 141.

The present invention is adopted for the composite charged particle beam apparatus. Accordingly, in the automatic sequence for repeatedly performing the FIB operation and the SEM observation which are applications specific to the composite charged particle beam apparatus, the automatic sequence can be performed for a long time. Furthermore, even if the SEM acceleration voltage is low, it is possible to acquire a high resolution image with improved current stability. Therefore, a user is allowed to have dramatically improved convenience.

REFERENCE SIGNS LIST

101: SEM COLUMN
102: ELECTRON GUN UNIT
103: ELECTRON BEAM BLANKING UNIT
104: ELECTRON BEAM
105: ELECTRON GUN CONTROL HIGH VOLTAGE POWER SUPPLY PROCESSING UNIT
106: ELECTRON BEAM BLANKING PROCESSING UNIT
107: SEM COLUMN CONTROL PROCESSING UNIT
111: FIB COLUMN
112: ION GUN UNIT
113: ION BEAM BLANKING UNIT
114: ION BEAM
115: ION GUN CONTROL HIGH VOLTAGE POWER SUPPLY PROCESSING UNIT
116: ION BEAM BLANKING PROCESSING UNIT
117: FIB COLUMN CONTROL PROCESSING UNIT
121: SAMPLE
122: SAMPLE CHAMBER
131: COMMON CONTROL MICROCOMPUTER UNIT
132: PC/WS
141: ARGON ION BEAM COLUMN
142: ION GUN UNIT
143: ARGON ION BEAM BLANKING UNIT
144: ARGON ION BEAM
145: ARGON ION GUN CONTROL HIGH VOLTAGE POWER SUPPLY PROCESSING UNIT
146: ARGON ION BEAM BLANKING PROCESSING UNIT
147: ARGON ION BEAM COLUMN CONTROL PROCESSING UNIT

The invention claimed is:

1. A composite charged particle beam apparatus comprising:
    a CFE-SEM that uses a CFE electron source for irradiating a sample with an electron beam;
    a FIB device that irradiates the sample with an ion beam; and
    a controller configured to control an automatic sequence for repeatedly performing sample observation using the CFE-SEM and sample processing using the FIB device,
    wherein, in the automatic sequence, during each sample processing using the FIB device, or during each transition time between the sample observation using the CFE-SEM and the sample processing using the FIB device, the controller is further configured to perform flushing while an extraction voltage is applied to the CFE electron source.

2. The composite charged particle beam apparatus according to claim 1,
    wherein, in the automatic sequence, the sample observation using the CFE-SEM and sample section machining using the FIB device are repeatedly performed so as to perform three-dimensional structure or composition analysis on the sample.

3. The composite charged particle beam apparatus according to claim 1, further comprising:
    a gas nozzle that introduces deposition gas,
    wherein, in the automatic sequence, the sample observation using the CFE-SEM and deposition processing using the FIB device are repeatedly performed.

4. The composite charged particle beam apparatus according to claim 1, further comprising:
    a gas nozzle that introduces etching gas,
    wherein, in the automatic sequence, the sample observation using the CFE-SEM and an assist etching process using the FIB device are repeatedly performed.

5. The composite charged particle beam apparatus according to claim 1,
    wherein, in the automatic sequence, the flushing is performed with the lapse of a prescribed time after the sample processing using the FIB device starts.

6. The composite charged particle beam apparatus according to claim 1,
    wherein, in the automatic sequence, the flushing is performed with the lapse of a prescribed time after the sample processing using the FIB device ends.

7. The composite charged particle beam apparatus according to claim 1,
    wherein, in the automatic sequence, the flushing is performed with the lapse of a prescribed time after the sample observation using the CFE-SEM ends.

8. The composite charged particle beam apparatus according to claim 1,
    wherein, in the automatic sequence, the flushing is repeatedly performed during each sample processing using the FIB device, and another flushing which is stronger than the flushing is performed after the sample observation using the CFE-SEM.

9. The composite charged particle beam apparatus according to claim 1, wherein the ion beam is a gallium ion beam, a neon ion beam, an argon ion beam, a helium ion beam, a xenon ion beam, an oxygen ion beam, or a nitrogen ion beam.

10. A control method in an automatic sequence comprising:

repeatedly performing an automatic sequence of sample observation using a CFE-SEM and sample processing using a FIB device, wherein, during each sample processing using the FIB device, or during each transition time between the sample observation using the CFE-SEM and the sample processing using the FIB device, flushing is performed while an extraction voltage is applied to a CFE electron source.

11. The control method according to claim 10, wherein, in the automatic sequence, the sample observation using the CFE-SEM and sample section machining using the FIB device are repeatedly performed so as to perform three-dimensional structure/composition analysis on the sample.

12. The control method according to claim 10, wherein, in the automatic sequence, the sample observation using the CFE-SEM and deposition processing using the FIB device and deposition gas are repeatedly performed.

13. The control method according to claim 10, wherein, in the automatic sequence, the sample observation using the CFE-SEM and an assist etching process using the FIB device and assist etching gas are repeatedly performed.

14. The control method according to claim 10, wherein, in the automatic sequence, the flushing is performed with the lapse of a prescribed time after the sample processing using the FIB device starts.

15. The control method according to claim 10, wherein, in the automatic sequence, the flushing is performed with the lapse of a prescribed time after the sample processing using the FIB device ends.

16. The control method according to claim 10, wherein, in the automatic sequence, the flushing is performed with the lapse of a prescribed time after the sample observation using the CFE-SEM ends.

17. The control method according to claim 10, wherein, in the automatic sequence, the flushing is repeatedly performed during each sample processing using the FIB device, and another flushing which is stronger than the flushing is performed after the sample observation using the CFE-SEM.

18. The control method according to claim 10, wherein the ion beam is a gallium ion beam, a neon ion beam, an argon ion beam, a helium ion beam, a xenon ion beam, an oxygen ion beam, or a nitrogen ion beam.

* * * * *